United States Patent
Yu et al.

[19]

[11] Patent Number: 5,817,571
[45] Date of Patent: Oct. 6, 1998

[54] MULTILAYER INTERLEVEL DIELECTRICS USING PHOSPHORUS-DOPED GLASS

[75] Inventors: Chen-Hua Douglas Yu; Syun-Ming Jang; Huang Yuan-Chang, all of Hsin-Chu, Taiwan

[73] Assignee: Taiwan Semiconductor Manufacturing Company, Ltd., Hsin-Chu, Taiwan

[21] Appl. No.: 661,286

[22] Filed: Jun. 10, 1996

[51] Int. Cl.⁶ .................................................. H01L 21/44
[52] U.S. Cl. ........................ 438/622; 438/626; 438/697; 438/699; 438/784; 438/782; 438/624; 438/631; 438/622
[58] Field of Search ..................................... 437/228, 231, 437/238; 438/626, 697, 699, 784, 782, 624, 631, 622

[56] References Cited

U.S. PATENT DOCUMENTS

| | | | |
|---|---|---|---|
| 4,654,113 | 3/1987 | Tuchiya et al. | 438/631 |
| 4,731,346 | 3/1988 | Ashwell | 438/784 |
| 5,169,801 | 12/1992 | Sato | 437/195 |
| 5,352,630 | 10/1994 | Kim et al. | 437/195 |
| 5,391,517 | 2/1995 | Gelatos et al. | 437/190 |
| 5,393,708 | 2/1995 | Hsia et al. | 438/782 |
| 5,578,523 | 11/1996 | Fiordalice et al. | 437/190 |
| 5,583,359 | 12/1996 | Ng et al. | 257/306 |
| 5,618,751 | 4/1997 | Golden et al. | 437/60 |
| 5,635,425 | 6/1997 | Chen | 438/631 |

OTHER PUBLICATIONS

Stanley Wolf, Silicon Processing for the VLSI Era, vol. II, 1990.

*Primary Examiner*—Charles Bowers
*Assistant Examiner*—Thang Nguyen
*Attorney, Agent, or Firm*—George O. Saile; Stephen B. Ackerman; Rosemary L. S. Pike

[57] ABSTRACT

A method for forming a planarized interlevel dielectric layer without degradation due to microloading effect is described. A first conformal layer of silicon dioxide is deposited overlying a conducting layer over an insulating layer on a semiconductor substrate. A second silicon dioxide layer is deposited overlying the first conformal silicon dioxide layer. A doped glass layer is deposited overlying the second silicon dioxide layer. The doped glass layer is coated with a spin-on-glass layer. The spin-on-glass layer is etched back until the interlevel dielectric layer is planarized. The microloading effects from the etching back of the spin-on-glass layer of the interlevel dielectric layer are lower than microloading effects in a conventional interlevel dielectric layer.

29 Claims, 4 Drawing Sheets

MULTILAYER INTERLEVEL DIELECTRICS USING PHOSPHORUS-DOPED GLASS

BACKGROUND OF THE INVENTION

(1) FIELD OF THE INVENTION

The present invention relates to the fabrication of integrated circuit devices, and more particularly, to a method of forming multilayer interlevel dielectrics in the fabrication of integrated circuits.

(2) DESCRIPTION OF THE PRIOR ART

In the fabrication of integrated circuits having multiple conducting levels, planarization of the interlevel dielectric is of high importance. Often, the interlevel dielectric is formed by depositing an undoped silicon dioxide over the surfaces of a conducting layer, coating on a spin-on-glass layer, and etching back to provide a planarized dielectric surface. FIG. 1 illustrates a partially completed integrated circuit device in which gate electrodes 16 have been formed over field oxide 12 and gate oxide 14 on the surface of a semiconductor substrate 10. Undoped silicon oxide layer 18 is formed over the surface of the patterned conducting layer 16. Spin-on-glass layer 20 is coated over the silicon oxide surface. The spin-on-glass 20 is etched back using a plasma etch, resulting in a planarize layer as shown in FIG. 2.

However, when the silicon oxide layer 18 is exposed to $CF_4/CHF_3$ plasma during etchback, oxygen atoms will be released from their Si—O bondings. These oxygen atoms consume the adjacent spin-on-glass Si—O bondings, thus enhancing the spin-on-glass etch rate. This is called the microloading effect. The etch recipe is tuned so that the silicon oxide and the spin-on-glass will be etched at the same rate. If microloading effects occur, the spin-on-glass etch rate is faster than expected; therefore more of. The spin-on-glass is consumed than expected. This results in degradation of the planarization.

U.S. Pat. No. 5,352,630 to Kim et al teaches control of the dielectric thickness over different regions of a semiconductor substrate without using spin-on-glass. All examples discussed have an underlayer of undoped oxide which will induce microloading effects degrading the smoothness of the etched surface. U.S. Pat. No. 5,169,801 to Sato teaches unifying the thickness of a dielectric layer by etching back a spin-coating and the dielectric layer until the spin coating is completely removed.

SUMMARY OF THE INVENTION

Accordingly, it is a primary object of the invention to provide a reliable and very manufacturable process for forming an interlevel dielectric layer in the fabrication of an integrated circuit.

It is a further object of the invention to provide a method for forming a planarized interlevel dielectric layer in the fabrication of an integrated circuit.

It is another object to provide a process for forming a planarized interlevel dielectric layer without degradation due to the microloading effect.

Yet another object is to provide a process for forming a planarized interlevel dielectric layer without degradation due to the microloading effect and without mobile charge movement.

In accordance with the objects of the invention, a method for forming a planarized interlevel dielectric layer without degradation due to microloading effect is achieved. A first conformal layer of silicon dioxide is deposited overlying a conducting layer over an insulating layer on a semiconductor substrate. A second silicon dioxide layer is deposited overlying the first conformal silicon dioxide layer. A doped glass layer is deposited overlying the second silicon dioxide layer. The doped glass layer is coated with a spin-on-glass layer. The spin-on-glass layer is etched back until the interlevel dielectric layer is planarized. The microloading effects from the etching back of the spin-on-glass layer of the interlevel dielectric layer are lower than microloading effects in a conventional interlevel dielectric layer.

BRIEF DESCRIPTION OF THE DRAWINGS

In the accompanying drawings forming a material part of this description, there is shown.

DESCRIPTION OF THE PREFERRED EMBODIMENTS

Figure 1:
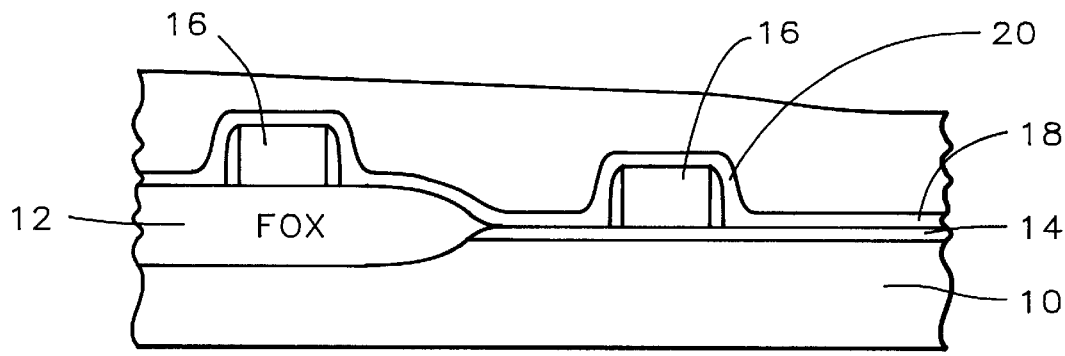
FIGS. 1 and 2 schematically illustrate in cross-sectional representation an interlevel dielectric process of the prior art.
Figure 2:
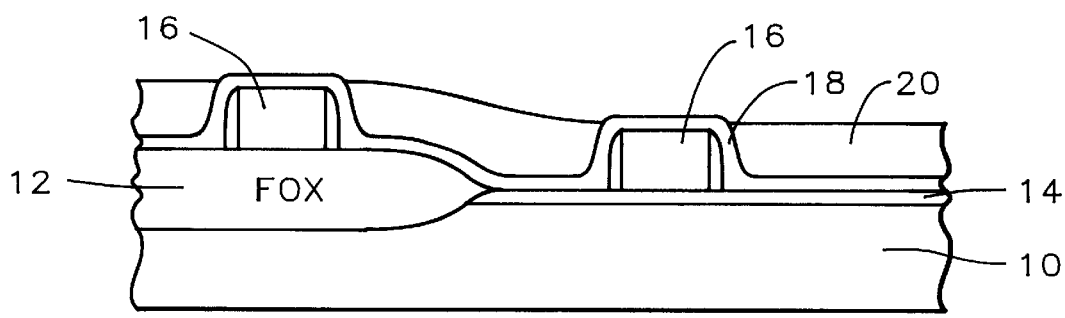

The process of the invention applies to an interlevel dielectric layer over any level conducting layer. This can be a first level conducting layer, such as gate electrodes, or it can be a first level or second level metallization. A first level conducting layer will be illustrated in the drawings, but it is to be understood that the invention applies to any level conducting layer.

Figure 3:
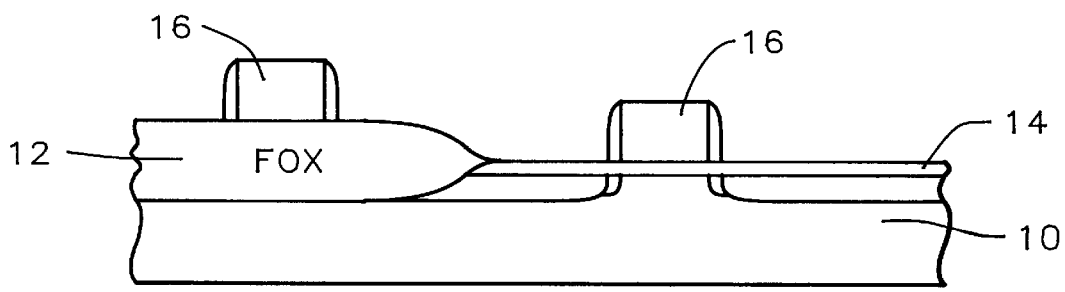
FIGS. 3 through 8 schematically illustrate in cross-sectional representation a preferred embodiment of the present invention.

Referring now more particularly to FIG. 3, there is shown a portion of a partially completed integrated circuit. The semiconductor substrate 10 is preferably composed of monocrystalline silicon. Field oxide regions 12 may be formed to separate active areas. Gate electrodes 16 overlying gate silicon oxide 14 or field oxide 12 are formed as is conventional in the art. The top surface of the conducting layer is irregular having peaks and valleys.

Figure 4:
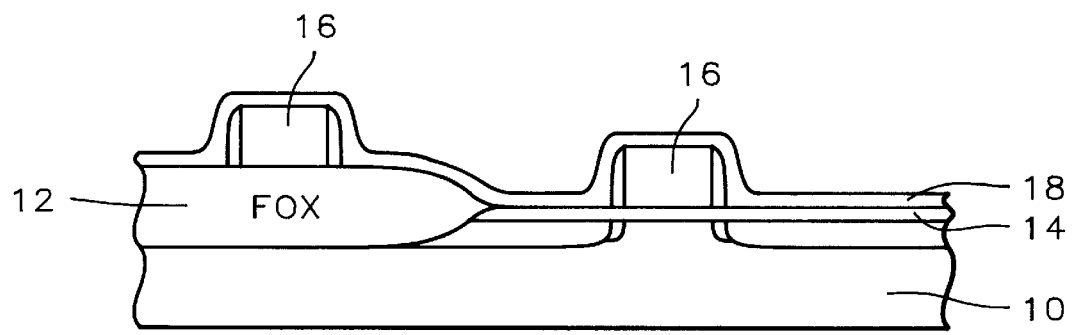

A conformal layer of silicon dioxide 18 is deposited using plasma enhanced chemical vapor deposition (PECVD) to a thickness of between about 1000 to 3000 Angstroms, as shown in FIG. 4. This barrier layer is preferably undoped for best performance. The layer 18 may be plasma enhanced tetraethoxysilane (PETEOS), plasma enhanced oxide (PEOX), or undoped oxide.

Figure 5:
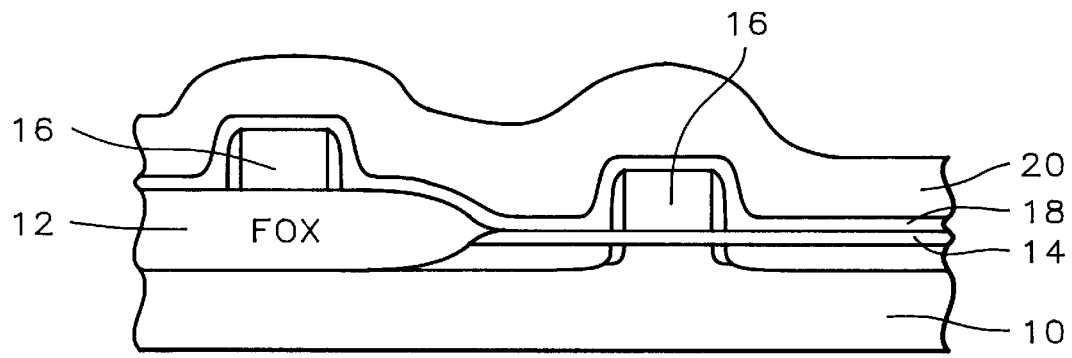

Referring now to FIG. 5, a layer of silicon dioxide 20 is deposited by subatmospheric pressure chemical vapor deposition (SACVD) to a thickness of between about 3000 to 7000 Angstroms. This TEOS-based oxide deposition provides superior gap-filling performance. Other good gap-filling deposition may be used, such as ECR oxide and high density plasma (HDP) oxide which will provide good gap-filling properties without applying high temperatures.

Figure 6:
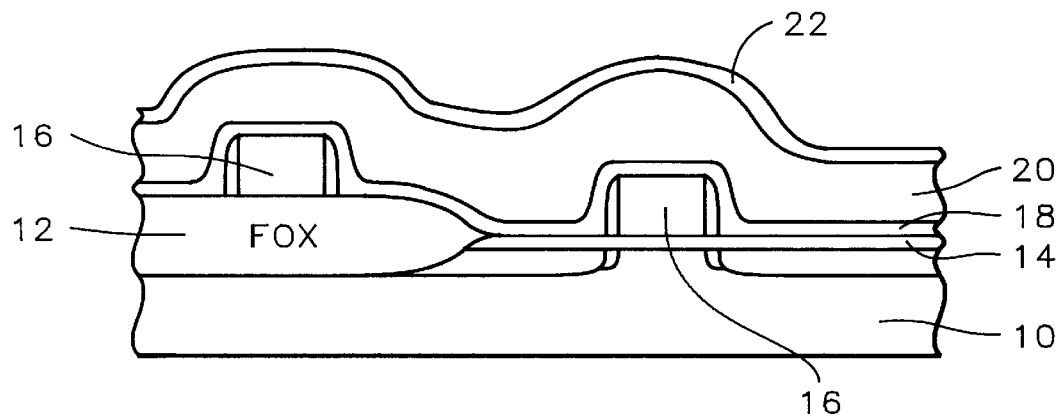

The key feature of the present invention will now be described with reference to FIG. 6. In the prior art, a capping layer of undoped silicon dioxide or undoped glass is deposited over the silicon dioxide layer 20. This capping layer prevents the absorption of moisture by the gap-filling layer 20. In the present invention, the undoped glass is replaced by a TEOS-based doped glass layer 22 which is deposited by atmospheric pressure chemical vapor deposition (APCVD).

The glass layer 22 can be doped with any dopant such as phosphorus, boron, or arsenic to reduce the microloading effect. The preferred dopant is phosphorus with a dopant concentration of between about 3 to 4%.

Figure 7:
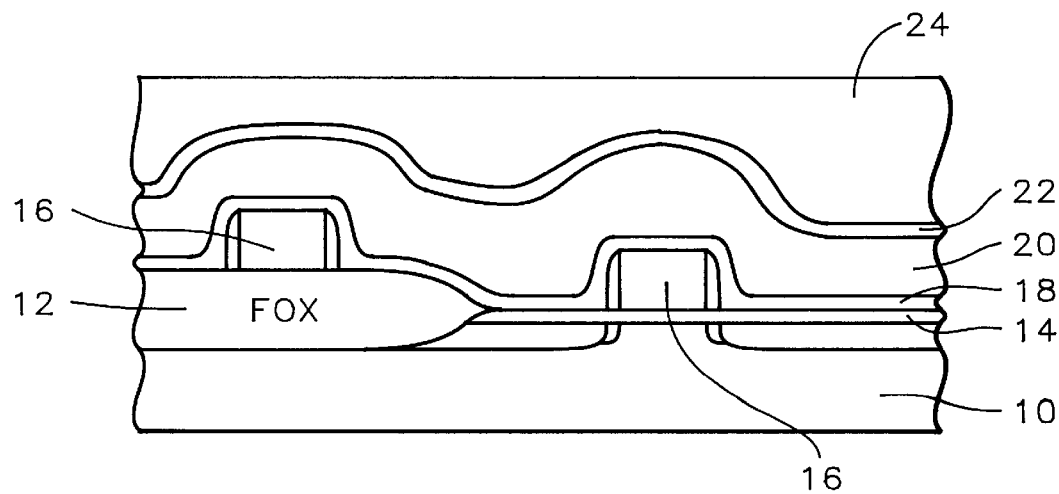

Next a layer of siloxane or silicate spin-on-glass 24 is coated over the surface of the doped glass layer 22, as shown in FIG. 7.

Figure 8:
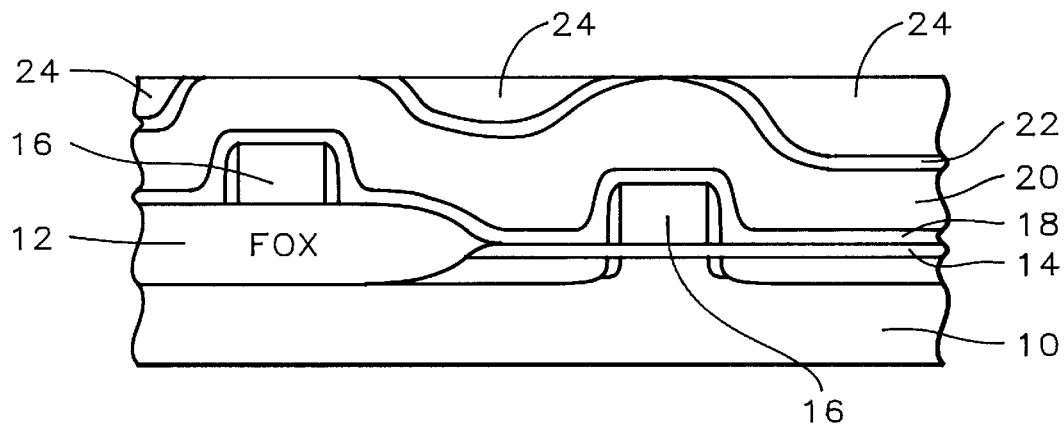

Referring now to FIG. 8, the spin-on-glass is etched back until almost all the spin-on-glass is consumed. Typically, the etchback thickness is close to the spin-on-glass coating thickness.

The process of the invention significantly reduces the microloading effect after spin-on-glass etchback resulting in excellent planarization of the interlevel dielectric layer. It is believed that the mechanism of the reduction of the microloading effect may be twofold. First, the increased plasma etch rate selectivity of the doped glass to the spin-on-glass results in good planarization when the doped glass, such as PSG, and the spin-on-glass are exposed to plasma simultaneously. Secondly, fewer oxygen radicals are generated from the etched doped glass capping layer 22 resulting in less of an enhanced spin-on-glass etch rate. In doped glass, oxygen is easily bonded to the dopant which may deactivate the oxygen atom reaction.

Although any dopant can be added to the glass layer 22 to reduce the microloading effect, phosphorus is preferred in the process of the invention because phosphorus acts as a movement barrier to mobile charges resulting from plasma etching. Mobile charges come from the ambient and from photoresist and decrease the oxide dielectric properties, such as capacitance. A phosphosilicate glass (PSG) can prevent the penetration of mobile charges.

Figure 9:
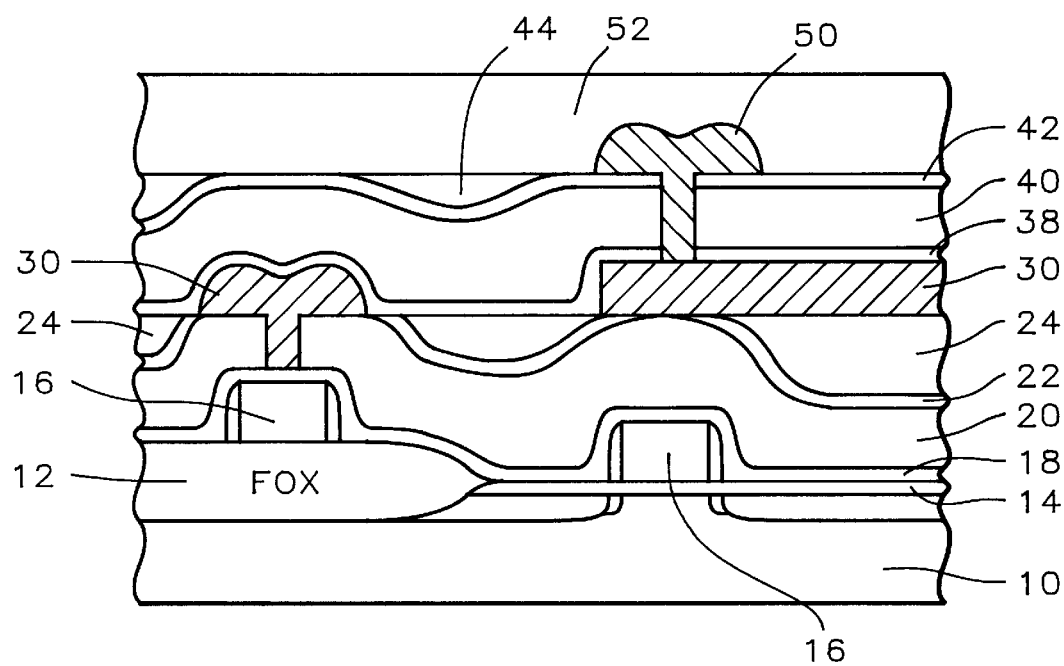
FIG. 9 schematically illustrates in cross-sectional representation a completed integrated circuit device of the present invention.

FIG. 9 illustrates a completed integrated circuit device fabricated according to the process of the present invention. After the spin-on-glass etchback described with reference to FIG. 8, contact openings are formed through the intermetal dielectric layer to the underlying conducting layer 16. A second conducting layer 30 is deposited and patterned to complete electrical connection to the underlying conducting layer. Now, an intermetal dielectric is formed over this conducting layer 30 according to the process of the invention as described above. Layer 38 corresponds to PECVD silicon dioxide layer 18, 40 corresponds to SACVD silicon dioxide layer 20, 42 corresponds to doped glass layer 22, and 44 corresponds to spin-on-glass layer 24 which is etched back to planarize the intermetal dielectric layer. A third conducting layer 50 is deposited over the surface of the intermetal dielectric and into contact openings in that layer and patterned. A passivation layer 52 completes fabrication of the integrated circuit device.

The process of the invention results in excellent planarization of an intermetal dielectric layer with significantly reduced microloading effect at the spin-on-glass etchback step.

While the invention has been particularly shown and described with reference to the preferred embodiments thereof, it will be understood by those skilled in the art that various changes in form and details may be made without departing from the spirit and scope of the invention.

What is claimed is:

1. A method of fabricating an integrated circuit device having an improved interlevel dielectric layer including a spin-on-glass layer with better planarization than the conventional interlevel dielectric layer including a spin-on-glass layer in a conventional integrated circuit device comprising:

providing a first conducting layer over an insulating layer on a semiconductor substrate;

forming said improved interlevel dielectric layer over said first conducting layer comprising the steps:

depositing a first conformal layer of silicon dioxide overlying said first conducting layer;

depositing a second silicon dioxide layer overlying said first conformal silicon dioxide layer;

depositing a doped glass layer overlying said second silicon dioxide layer; and coating said doped glass layer with said spin-on-glass layer;

etching back said spin-on-glass layer until said improved interlevel dielectric layer is planarized wherein microloading effects from said etching back of said spin-on-glass layer of said improved interlevel dielectric layer are lower than microloading effects in said conventional interlevel dielectric layer because of said directly underlying doped glass layer;

providing a second conducting layer over said planarized improved interlevel dielectric layer; and passivating said second conducting layer to complete the fabrication of said integrated circuit device.

2. The method according to claim 1 wherein said first conformal silicon dioxide layer is deposited by plasma enhanced chemical vapor deposition to a thickness of between about 1000 to 3000 Angstroms.

3. The method according to claim 1 wherein said second silicon dioxide layer is deposited by subatmospheric chemical vapor deposition to a thickness of between about 3000 to 7000 Angstroms.

4. The method according to claim 1 wherein said doped glass layer is deposited by plasma enhanced chemical vapor deposition to a thickness of between about 1000 to 3000 Angstroms.

5. The method according to claim 1 wherein said doped glass layer is doped with phosphorus to a concentration of between about 3 to 4%.

6. The method according to claim 1 wherein said doped glass layer is doped with boron to a concentration of between about 3 to 7%.

7. The method according to claim 1 wherein said doped glass layer is doped with arsenic to a concentration of between about 3 to 7%.

8. The method according to claim 1 wherein said spin-on-glass layer is coated to a thickness of between about 3000 to 7000 Angstroms.

9. The method according to claim 1 wherein said etching back of said spin-on-glass layer is done using a $CF_4/CHF_3$ plasma etch.

10. The method according to claim 1 wherein said doped glass layer acts as a movement barrier for mobile charges.

11. The method according to claim 1 wherein said doped glass layer is a TEOS-based doped glass layer.

12. A method of forming an improved interlevel dielectric layer including a spin-on-glass layer with better planarization than a conventional interlevel dielectric layer including a spin-on-glass layer comprising:

depositing a first conformal layer of silicon dioxide overlying a conducting layer over an insulating layer on a semiconductor substrate;

depositing a second silicon dioxide layer overlying said first conformal silicon dioxide layer;

depositing a TEOS-based doped glass layer overlying said second silicon dioxide layer;

coating said TEOS-doped glass layer with a spin-on-glass layer; and etching back said spin-on-glass layer until said improved interlevel dielectric layer is planarized wherein microloading effects from said etching back of said spin-onglass layer of said improved interlevel dielectric layer are lower than microloading effects in said conventional interlevel dielectric layer because of said TEOS-based doped glass layer underlying said spin-on-glass layer.

13. The method according to claim 12 wherein said first conformal silicon dioxide layer is deposited by plasma enhanced chemical vapor deposition to a thickness of between about 1000 to 3000 Angstroms.

14. The method according to claim 12 wherein said second silicon dioxide layer is deposited by subatmospheric chemical vapor deposition to a thickness of between about 3000 to 7000 Angstroms.

15. The method according to claim 12 wherein said doped glass layer is deposited by plasma enhanced chemical vapor deposition to a thickness of between about 1000 to 3000 Angstroms.

16. The method according to claim 12 wherein said doped glass layer is doped with phosphorus to a concentration of between about 3 to 4%.

17. The method according to claim 12 wherein said doped glass layer is doped with boron to a concentration of between about 3 to 7%.

18. The method according to claim 12 wherein said doped glass layer is doped with arsenic to a concentration of between about 3 to 7%.

19. The method according to claim 12 wherein said spin-on-glass layer is coated to a thickness of between about 3000 to 7000 Angstroms.

20. The method according to claim 12 wherein said etching back of said spin-on-glass layer is done using a $CF_4/CHF_3$ plasma etch.

21. The method according to claim 12 wherein said lower microloading effects of said improved interlevel dielectric layer are due to the presence of said doped glass layer underlying said spin-on-glass layer.

22. The method according to claim 16 wherein said doped glass layer acts as a movement barrier for mobile charges.

23. A method of forming an improved interlevel dielectric layer including a spin-on-glass layer with better planarization than a conventional interlevel dielectric layer including a spin-on-glass layer comprising:

depositing a first conformal layer of silicon dioxide overlying a conducting layer over an insulating layer on a semiconductor substrate;

depositing a second silicon dioxide layer overlying said first conformal silicon dioxide layer;

depositing a phosphorus-doped glass layer overlying said second silicon dioxide layer;

coating said phosphorus-doped glass layer with a spin-on-glass layer; and etching back said spin-on-glass layer until said improved interlevel dielectric layer is planarized wherein microloading effects from said etching back of said spin-on-glass layer of said improved interlevel dielectric layer are lower than microloading effects in said conventional interlevel dielectric layer because of said doped glass layer underlying said spin-on-glass layer.

24. The method according to claim 23 wherein said first conformal silicon dioxide layer is deposited by plasma enhanced chemical vapor deposition to a thickness of between about 1000 to 3000 Angstroms.

25. The method according to claim 23 wherein said second silicon dioxide layer is deposited by subatmospheric chemical vapor deposition to a thickness of between about 3000 to 7000 Angstroms.

26. The method according to claim 23 wherein said phosphorus doped glass layer is deposited by plasma enhanced chemical vapor deposition to a thickness of between about 1000 to 3000 Angstroms and wherein said phosphorus doped glass layer is doped with phosphorus to a concentration of between about 3 to 4%.

27. The method according to claim 23 wherein said spin-on-glass layer is coated to a thickness of between about 3000 to 7000 Angstroms.

28. The method according to claim 23 wherein said etching back of said spin-on-glass layer is done using a $CF_4/CHF_3$ plasma etch.

29. The method according to claim 23 wherein said doped glass layer acts as a movement barrier for mobile charges.

* * * * *

UNITED STATES PATENT AND TRADEMARK OFFICE
CERTIFICATE OF CORRECTION

PATENT NO. : 5,817,571
DATED : 10/6/98
INVENTOR(S) : Chen-Hua Douglas Yu, Syun-Ming Jang, Yuan-Chang Huang It is certified that error appears in the above-indentified patent and that said Letters Patent is hereby corrected as shown below:

On the Cover Page, at (75), delete "HUANG YUAN-CHANG" and replace with --YUAN-CHANG HUANG--.

Signed and Sealed this

Ninth Day of March, 1999

Attest:

Q. TODD DICKINSON

*Attesting Officer*                *Acting Commissioner of Patents and Trademarks*